(12) United States Patent
Cheng et al.

(10) Patent No.: US 10,304,736 B2
(45) Date of Patent: May 28, 2019

(54) SELF-ALIGNED CONTACT

(71) Applicant: INTERNATIONAL BUSINESS MACHINES CORPORATION, Armonk, NY (US)

(72) Inventors: Kangguo Cheng, Schenectady, NY (US); Xin Miao, Guilderland, NY (US); Wenyu Xu, Albany, NY (US); Chen Zhang, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/449,218

(22) Filed: Mar. 3, 2017

(65) Prior Publication Data

US 2017/0372957 A1 Dec. 28, 2017

Related U.S. Application Data

(62) Division of application No. 15/193,831, filed on Jun. 27, 2016, now Pat. No. 10,068,799.

(51) Int. Cl.
*H01L 21/768* (2006.01)
*H01L 21/28* (2006.01)
(Continued)

(52) U.S. Cl.
CPC .. *H01L 21/76897* (2013.01); *H01L 21/28114* (2013.01); *H01L 21/28247* (2013.01); *H01L 21/31116* (2013.01); *H01L 21/76805* (2013.01); *H01L 21/76808* (2013.01); *H01L 21/76813* (2013.01); *H01L 21/76831* (2013.01);
(Continued)

(58) Field of Classification Search
CPC ......... H01L 21/76831; H01L 21/76897; H01L 27/10888; H01L 29/42376; H01L 29/41783; H01L 29/41775
See application file for complete search history.

(56) References Cited

U.S. PATENT DOCUMENTS

| 5,874,353 A | 2/1999 | Lin et al. |
|---|---|---|
| 6,544,888 B2 | 4/2003 | Lee |

(Continued)

FOREIGN PATENT DOCUMENTS

| KR | 2003-0059445 A | 7/2003 |
|---|---|---|
| KR | 10-0471403 B1 | 3/2005 |
| KR | 20090035145 A | 4/2009 |

OTHER PUBLICATIONS

List of IBM Patents or Patent Applications Treated as Related dated Mar. 3, 2017, 2 pages.

*Primary Examiner* — Frederick B Hargrove
(74) *Attorney, Agent, or Firm* — Tutunjian & Bitetto, P.C.; Vazken Alexanian (57) ABSTRACT

A method for fabricating self-aligned contacts includes forming a liner over a gate structure having a gate conductor and one sidewall spacer and etching an exposed gate conductor to form a recess extending less than a width of the gate conductor. A dielectric layer is conformally deposited to fill the recess between the liner and the one sidewall spacer to form a partial dielectric cap formed on the gate conductor. A self-aligned contact is formed adjacent to the one sidewall spacer of the gate structure that is electrically isolated from the gate conductor by the partial dielectric cap and the at least one sidewall spacer.

16 Claims, 9 Drawing Sheets

(51) Int. Cl.
*H01L 23/522* (2006.01)
*H01L 23/528* (2006.01)
*H01L 21/311* (2006.01)
*H01L 29/423* (2006.01)
*H01L 29/49* (2006.01)
*H01L 23/485* (2006.01)

(52) U.S. Cl.
CPC .......... *H01L 23/485* (2013.01); *H01L 23/528* (2013.01); *H01L 23/5226* (2013.01); *H01L 29/42376* (2013.01); *H01L 29/4983* (2013.01)

(56) References Cited

U.S. PATENT DOCUMENTS

| | | |
|---|---|---|
| 6,797,557 B2 | 9/2004 | Chiang |
| 8,440,533 B2 | 5/2013 | Toh et al. |
| 9,293,576 B2 | 3/2016 | Cheng et al. |
| 2004/0084746 A1* | 5/2004 | Kim .................. H01L 21/28114 257/503 |
| 2008/0217707 A1 | 9/2008 | Anderson et al. |
| 2010/0207241 A1 | 8/2010 | Yoon et al. |

* cited by examiner

SELF-ALIGNED CONTACT

BACKGROUND

Technical Field

The present invention generally relates to self-aligned contacts and methods for making the same, and more particularly to a partial cap on a gate conductor to increase conductor volume of the gate conductor.

Description of the Related Art

A self-aligned contact (SAC) to a source/drain region is needed for complementary metal oxide semiconductor (CMOS) devices with tight contacted gate pitches. Conventional SAC methods require recessing a metal gate and forming an insulator cap on top of the metal gate. The insulator cap prevents electrical shorts between the SAC and metal gate. Recessing the metal gate for the insulator cap reduces the metal gate volume and thus increases gate resistance. A thick metal gate can help gate resistance reduction, but this comes with a penalty of increased parasitic capacitance between the metal gate and the contacts.

SUMMARY

In accordance with an embodiment of the present principles, a semiconductor device includes a gate structure having a gate conductor and a sidewall spacer. A partial dielectric cap is formed on the gate conductor and extends less than a width of the gate conductor. A self-aligned contact is formed adjacent to the sidewall spacer of the gate structure and is electrically isolated from the gate conductor by the partial dielectric cap and the sidewall spacer.

Another semiconductor device includes a substrate having source/drain regions formed therein and a plurality of gate structures, each having a gate conductor and at least one sidewall spacer. A partial dielectric cap is formed on at least one of the gate conductors and extends less than a width of the gate conductors. A liner is formed over the gate conductors and at least one sidewall spacer. The liner covers a portion of the gate conductors not covered by the partial cap. A self-aligned contact is formed adjacent to the at least one sidewall spacer of at least some of the gate structures to contact the source/drain regions and to be electrically isolated from the gate conductors by the partial dielectric cap and the at least one sidewall spacer.

A method for fabricating self-aligned contacts includes forming a liner over a gate structure having a gate conductor and at least one sidewall spacer; etching an exposed gate conductor to form a recess extending less than a width of the gate conductor; conformally depositing a dielectric layer to fill the recess between the liner and the at least one sidewall spacer to form a partial dielectric cap formed on the gate conductor; and forming a self-aligned contact adjacent to the at least one sidewall spacer of the gate structure and being electrically isolated from the gate conductor by the partial dielectric cap and the at least one sidewall spacer.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

In accordance with the present principles, methods and structures to form self-aligned contacts (SAC) while minimizing the impact of the SAC on gate resistance are provided. An insulator cap is formed on top of a gate conductor only in a region where the SAC is needed. A full height of the metal gate remains in a region outside of where the SAC is formed. This maintains low gate resistance since the gate may include a greater amount of conductive material.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements may be included in the compound and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Figure 1:
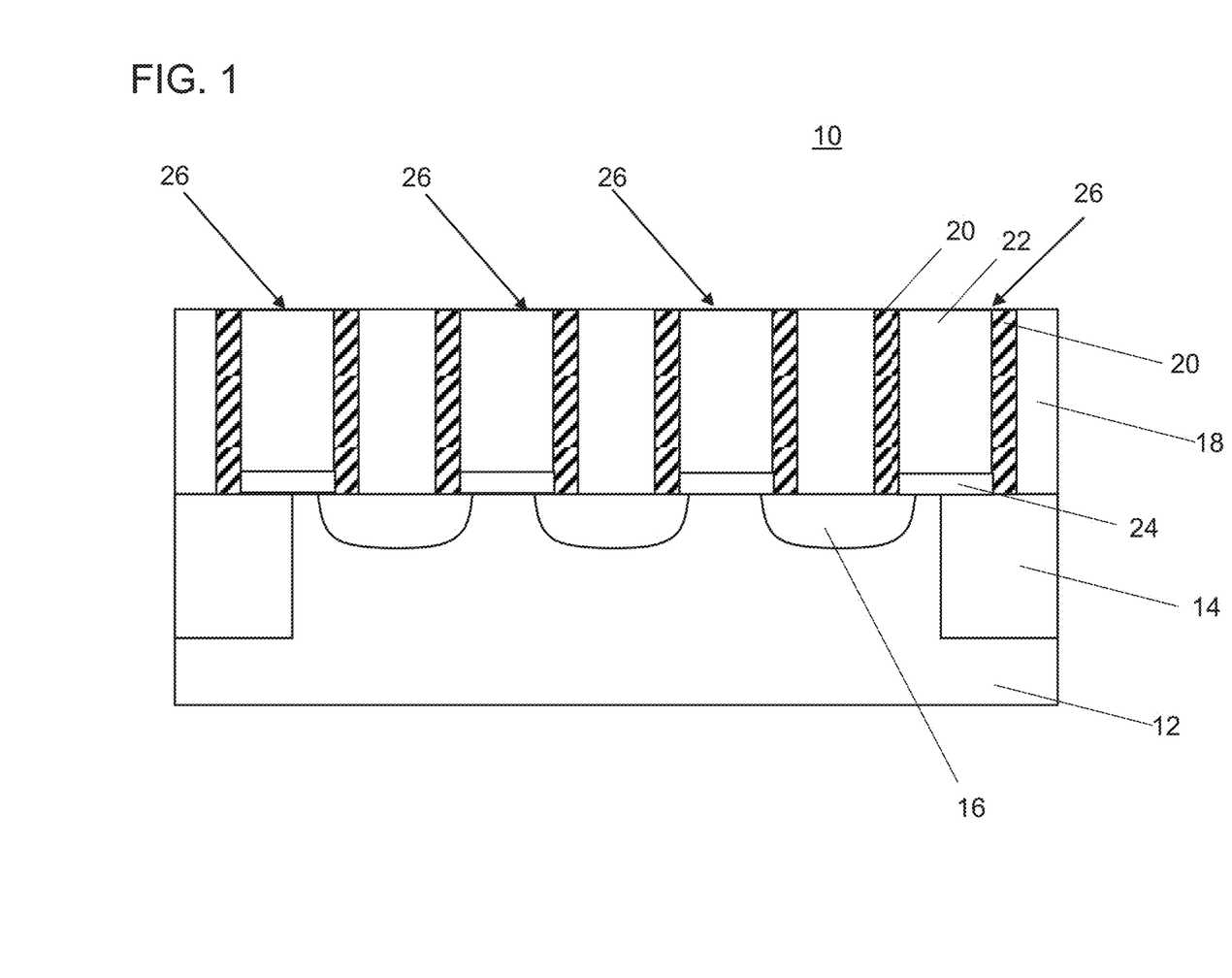
FIG. 1 is a cross-sectional view of a partially fabricated semiconductor device having source/drain regions formed in a substrate, gate structures formed between the source/drain regions and a first interlevel dielectric formed between the gate structures in accordance with the present principles.

Referring now to the drawings in which like numerals represent the same or similar elements and initially to FIG. 1, a partially fabricated semiconductor device 10 on a semiconductor substrate 12 is shown in accordance with one embodiment. The semiconductor substrate 12 may be a bulk-semiconductor substrate. In one example, the bulk-semiconductor substrate may be a silicon-containing material. Illustrative examples of Si-containing materials suitable for the bulk-semiconductor substrate include, but are not limited to Si, SiGe, SiGeC, SiC, polysilicon, e.g., polySi, epitaxial silicon, e.g., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc selenide.

Although not depicted in FIG. 1, the semiconductor substrate 12 may also be a semiconductor on insulator (SOI) substrate.

Shallow trench isolation (STI) regions 14 are formed by etching a trench in the substrate utilizing an etching process such as a reactive-ion etch (RIE) or plasma etch. The trenches may optionally be lined with a liner material, e.g., an oxide, and then chemical vapor deposition (CVD) or another like deposition process is employed to fill the trench with polysilicon or another STI dielectric material. The STI dielectric may optionally be densified after deposition. A conventional planarization process such as chemical-mechanical polishing (CMP) may optionally be used to provide a planar structure.

Next, transistors are formed. This may include the formation of gate structures including a gate dielectric 24, a gate conductor 22 and spacers 20. Then, source/drain regions 16 are formed.

The gate dielectric 24 is formed atop the substrate 12 and may include a dielectric material such as, e.g., an oxide material approximately 1 to 10 nm thick. The gate dielectric 24 is formed using conventional techniques such as chemical vapor deposition (CVD), atomic layer deposition (ALD), pulsed CVD, plasma of photo assisted CVD, sputtering, and chemical solution deposition, or alternatively, the gate dielectric 24 is formed by thermal growing process, which may include oxidation, oxynitridation, nitridation, and/or plasma or radical treatment. The gate dielectric 24 may include an oxide, nitride, oxynitride or any combination thereof. Suitable examples of oxides that can be employed as the gate dielectric 24 may include, but are not limited to: $SiO_2$, $Al_2O_3$, $ZrO_2$, $HfO_2$, $Ta_2O_3$, $TiO_2$, perovskite-type oxides and combinations and multi-layers thereof. Note that the gate dielectric 24 may be subsequently patterned into patterned gate dielectric 24.

The gate conductor 20 includes a conductive material, such as, e.g., polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

Spacers 20 reduce parasitic capacitance between the gate conductor 22 and the source/drain regions 16. The dielectric spacers 20 may be formed by using a blanket or conformal deposition, such as CVD, and an anisotropic etchback. The dielectric spacers 20 may be composed of a dielectric, such as a nitride, oxide, oxynitride, or a combination thereof.

Source/drain regions 16 may be formed in the semiconductor substrate 12 using the gate structures to align the source/drain regions 16. The source/drain regions 16 are doped regions that may be formed via ion implantation. When the semiconductor device 10 is a p-type conductivity semiconductor device, the source/drain regions 16 may be doped with a p-type dopant. As used herein, "p-type" refers to the addition of impurities to an intrinsic semiconductor that creates deficiencies of valence electrons. When the semiconductor device 10 is an n-type semiconductor device, the source/drain regions 16 may be doped with an n-type dopant. As used herein, "n-type" refers to the addition of impurities that contributes free electrons to an intrinsic semiconductor.

An interlevel dielectric (ILD) layer 18 is formed between the gate structures 26. The ILD layer 18 can be blanket deposited atop the entire device 10 and planarized. The blanket dielectric may be selected from the group consisting of silicon-containing materials such as $SiO_2$, $Si_3N_4$, $SiO_xN_y$, SiC, SiCO, SiCOH, and SiCH compounds; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials. A top surface of the device 10 may be planarized, e.g., using a CMP process.

Conventional processing recesses the gate conductor 22 at this point to make room for a gate cap. Instead, in accordance with the present principles, the gate conductor 22 remains un-recessed to provide additional gate conductor material as will be described.

Figure 2:
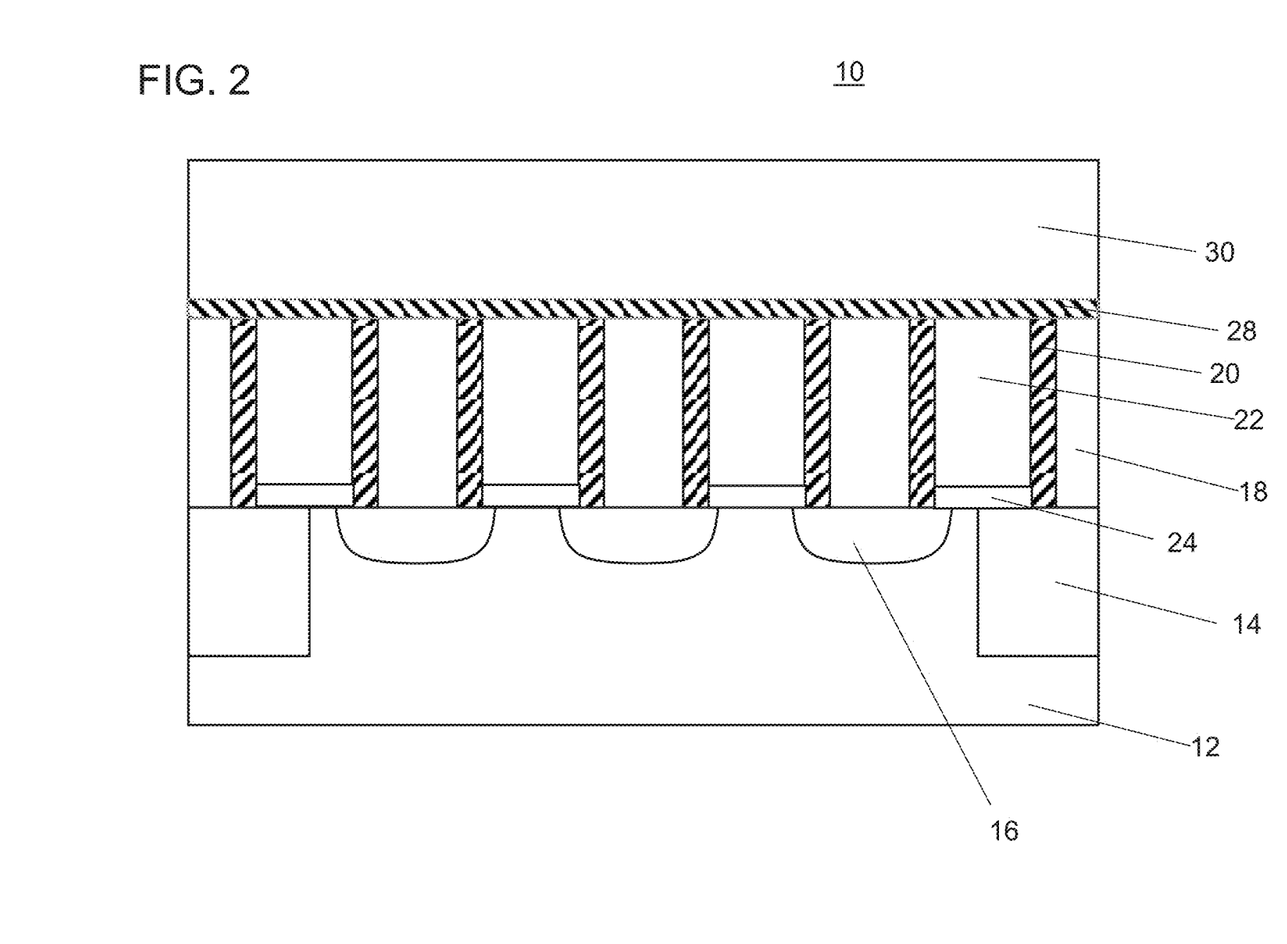
FIG. 2 is a cross-sectional view of the partially fabricated semiconductor device of FIG. 1 having a liner and a second interlevel dielectric formed over the gate structures and the first interlevel dielectric in accordance with the present principles.

Referring to FIG. 2, a liner 28 is deposited over the planarized surface of the gate structures 26 and the ILD layer 18. The liner 28 may include a blanket or conformally deposited dielectric layer, such as, e.g., a nitride, oxide, oxynitride, or a combination thereof. A second ILD layer 30 is formed on the liner 28. The ILD layer 30 can be blanket deposited atop the entire device 10 and planarized (e.g., by CMP). The blanket dielectric may be selected from the group consisting of silicon-containing materials such as $SiO_2$, $Si_3N_4$, $SiO_xN_y$, SiC, SiCO, SiCOH, and SiCH compounds; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials.

Figure 3:
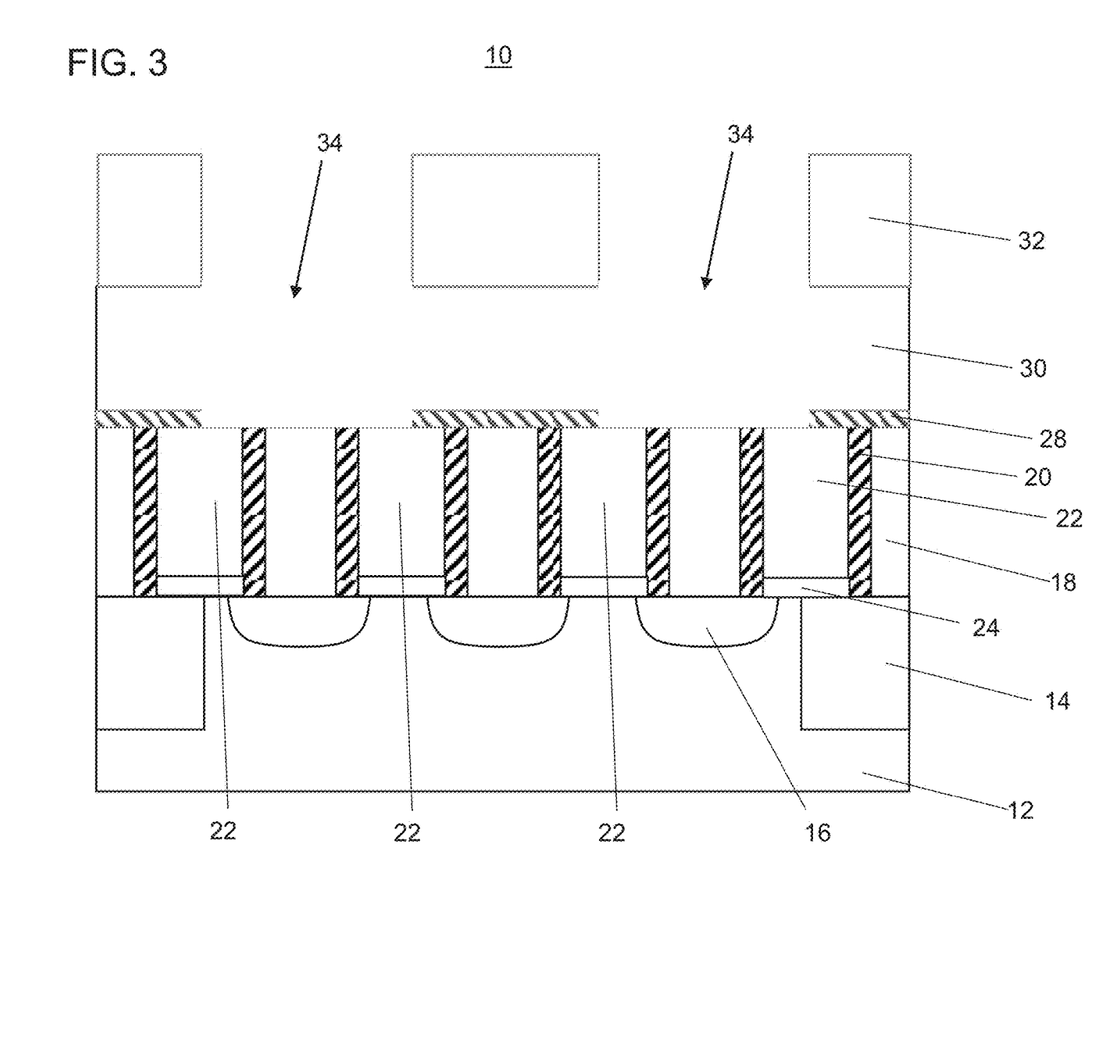
FIG. 3 is a cross-sectional view of the partially fabricated semiconductor device of FIG. 2 having a mask formed on the second interlevel dielectric and recesses formed to partially expose gate conductors in the gate structures in accordance with the present principles.

Referring to FIG. 3, a contact mask 32 is applied over the second ILD layer 30. The contact mask 32 may include a resist material, a dielectric mask material, such as e.g., nitride or oxynitride, or any other suitable material(s). The contact mask 32 may be developed (if resist) or lithographically patterned using a lithography process. The contact mask 32, the second ILD layer 30 and the liner 28 are opened up by an etch process, e.g., RIE. Each layer may be etched separately and act as an etch stop for the layer above it, or the layers may be etched in a same etch process or etched separately with and the contact mask 32 acting as an etch mask. The etch process forms recesses 34 to expose the ILD 18 and partially expose gate conductors 22 adjacent to each recess 34.

Figure 4:
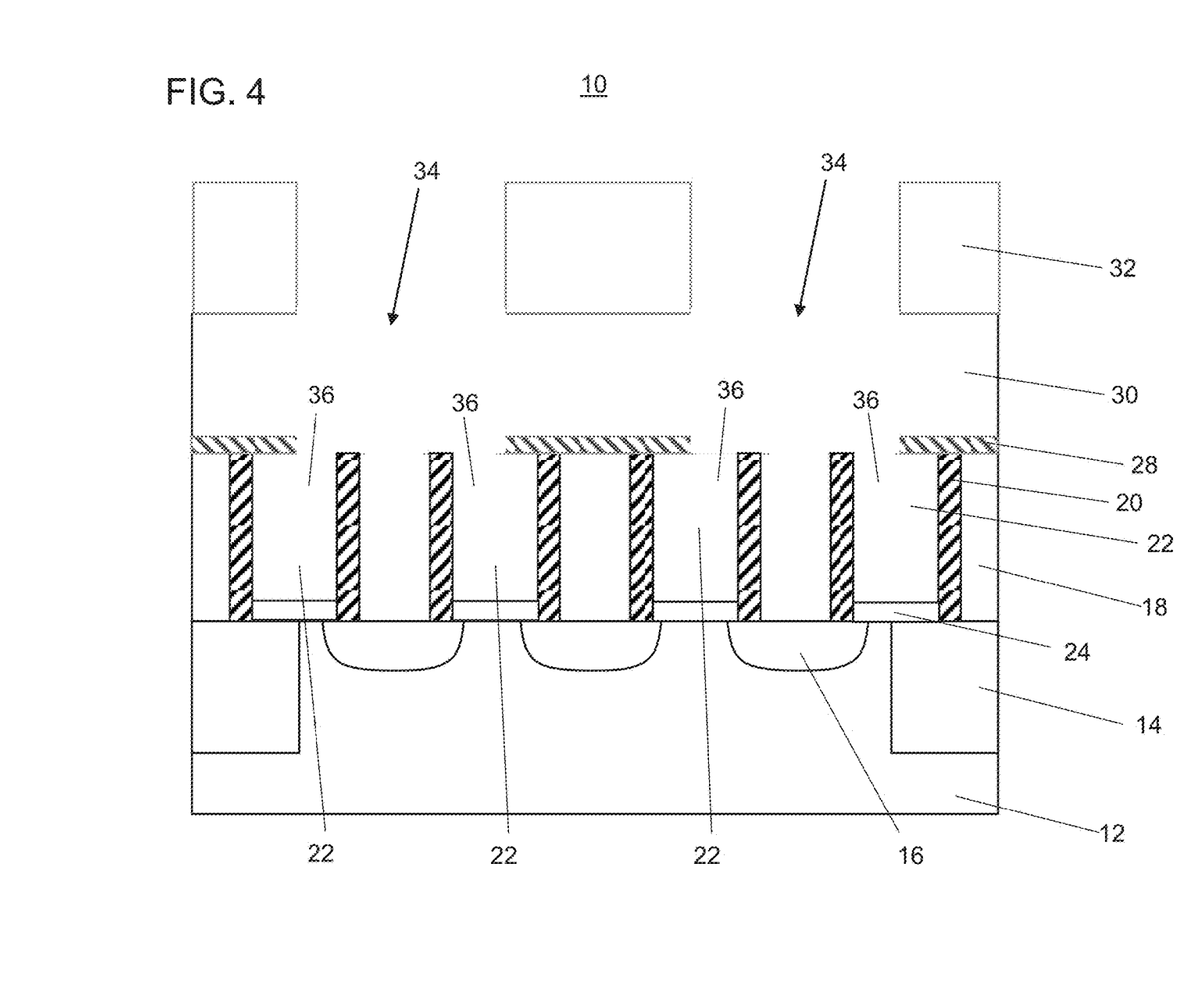
FIG. 4 is a cross-sectional view of the partially fabricated semiconductor device of FIG. 3 having recesses formed in the partially exposed gate conductors in the gate structures in accordance with the present principles.

Referring to FIG. 4, a selective timed etch is performed to open up recesses 36 in the gate conductor 22. The selective timed etch removes gate conductor material selectively to the spacers 20 and the ILD layer 18 and ILD layer 30. Since there is no cap layer on the gate conductor, extra conductive material is available in the gate conductor 22. The timed etch may be optimized to remove as little of gate conductor 22 as possible.

Figure 5:
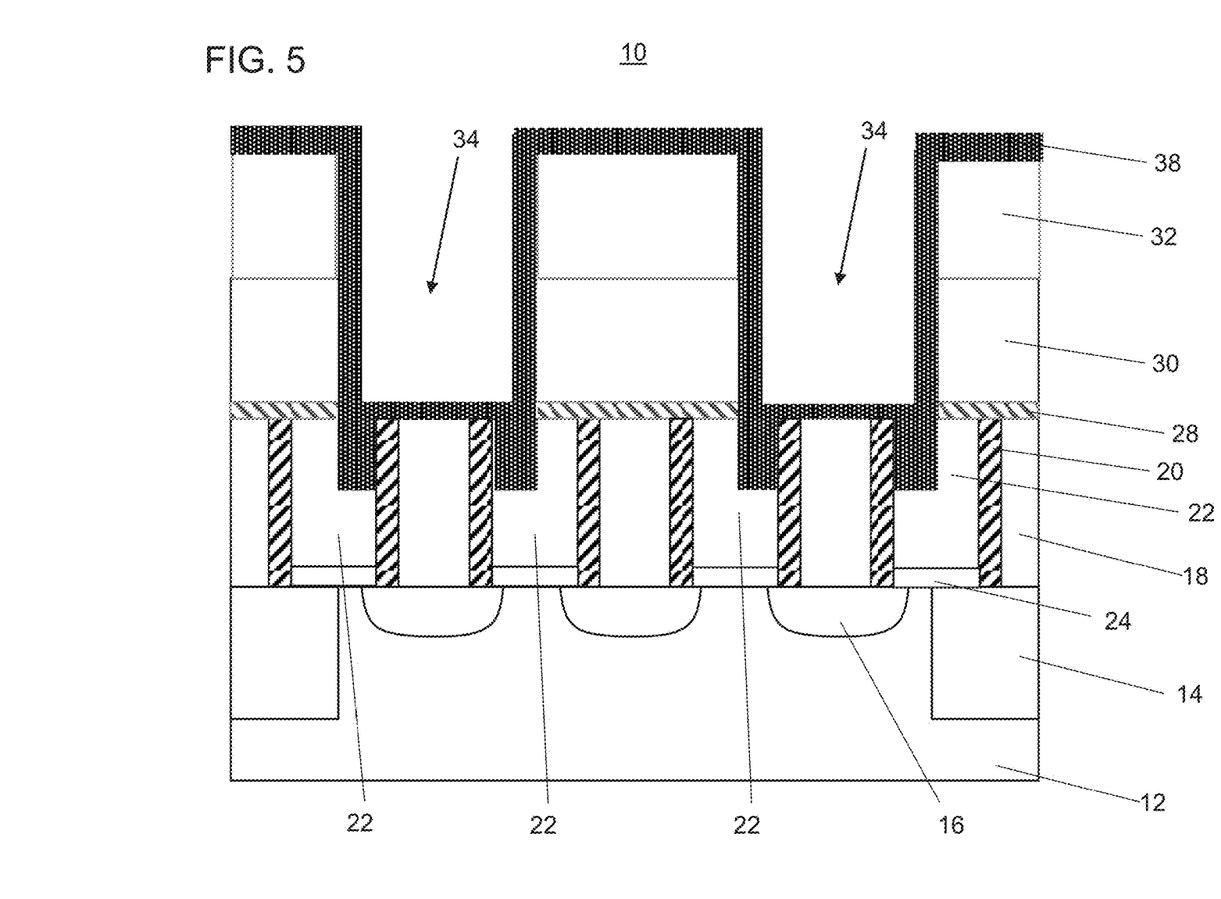
FIG. 5 is a cross-sectional view of the partially fabricated semiconductor device of FIG. 4 having a dielectric layer conformally deposited to fill in the recesses formed in the partially exposed gate conductors in the gate structures in accordance with the present principles.

Referring to FIG. 5, a dielectric layer 38 is deposited to fill the recesses 36 and to line recesses 34. The dielectric layer 38 is conformally deposited by a CVD process or other suitable deposition process. The dielectric layer 38 may include a nitride, an oxynitride or other material. The dielectric layer 38 pinches off the recessed gate conductor 22 to provide a dielectric barrier between the gate conductor 22 and the recess 34.

Figure 6:
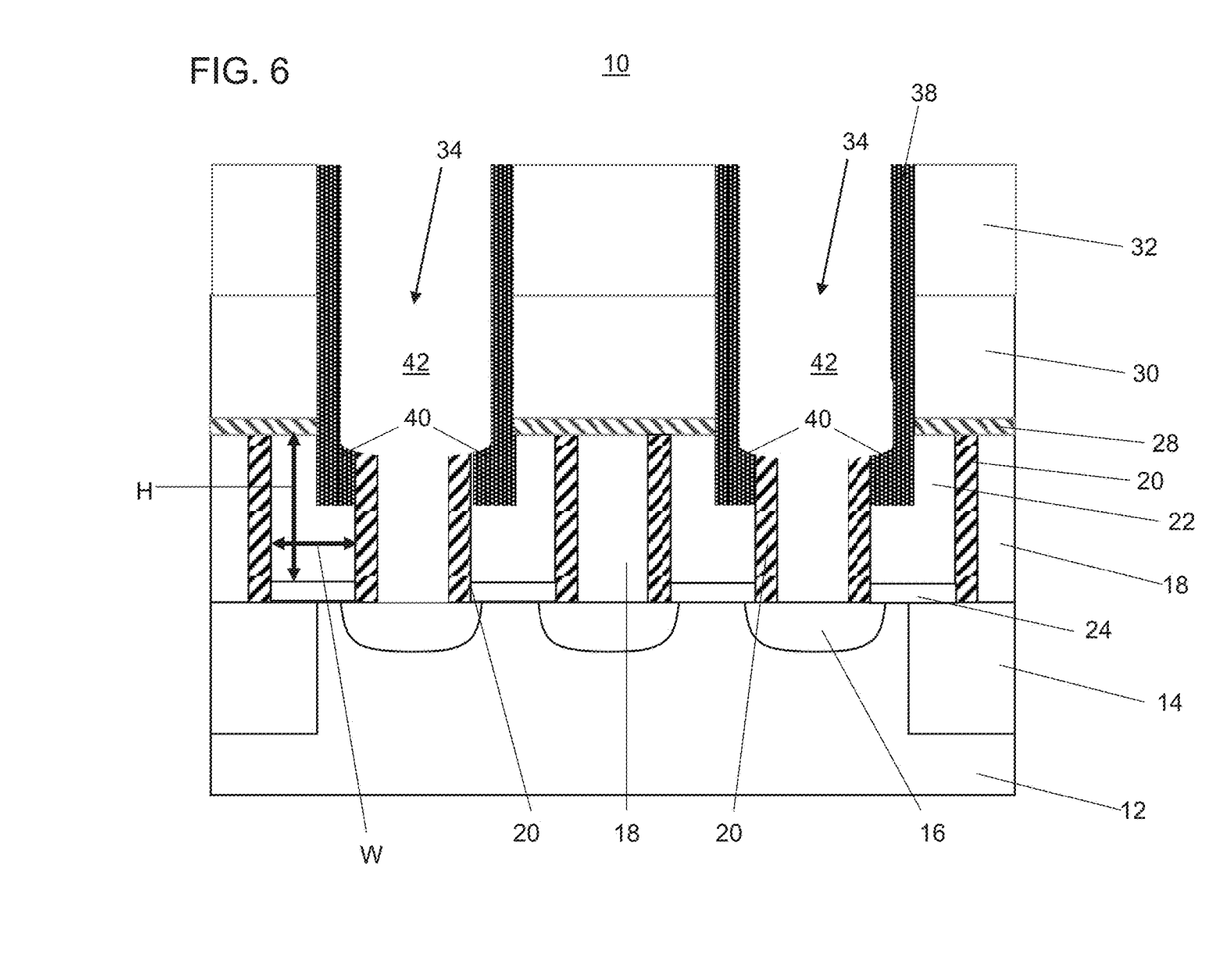
FIG. 6 is a cross-sectional view of the partially fabricated semiconductor device of FIG. 5 showing the dielectric layer and the first interlevel dielectric layer etched through to expose the source/drain regions in the substrate and form contact openings in accordance with the present principles.

Referring to FIG. 6, a RIE is performed to remove portions of the dielectric layer 38. The directional nature of the RIE process removes the horizontal portions of the dielectric layer 38 to form partial caps 40 on the gate conductor 22. The partial caps 40 along with the adjacent spacers 20 form an isolation barrier between the gate conductor 22 and the recess 34. The partial cap 40 may extend over less than about half of the gate conductor 22 width (W) and may be less than the gate conductor 22 height (H). In other embodiments, the partial cap 40 may extend over greater than about half of the gate conductor 22 width and may be greater than the gate conductor 22 height.

Another RIE process is performed to remove the ILD 18 to expose the source/drain regions 16. This forms a self-aligned contact hole or opening 42.

Figure 7:
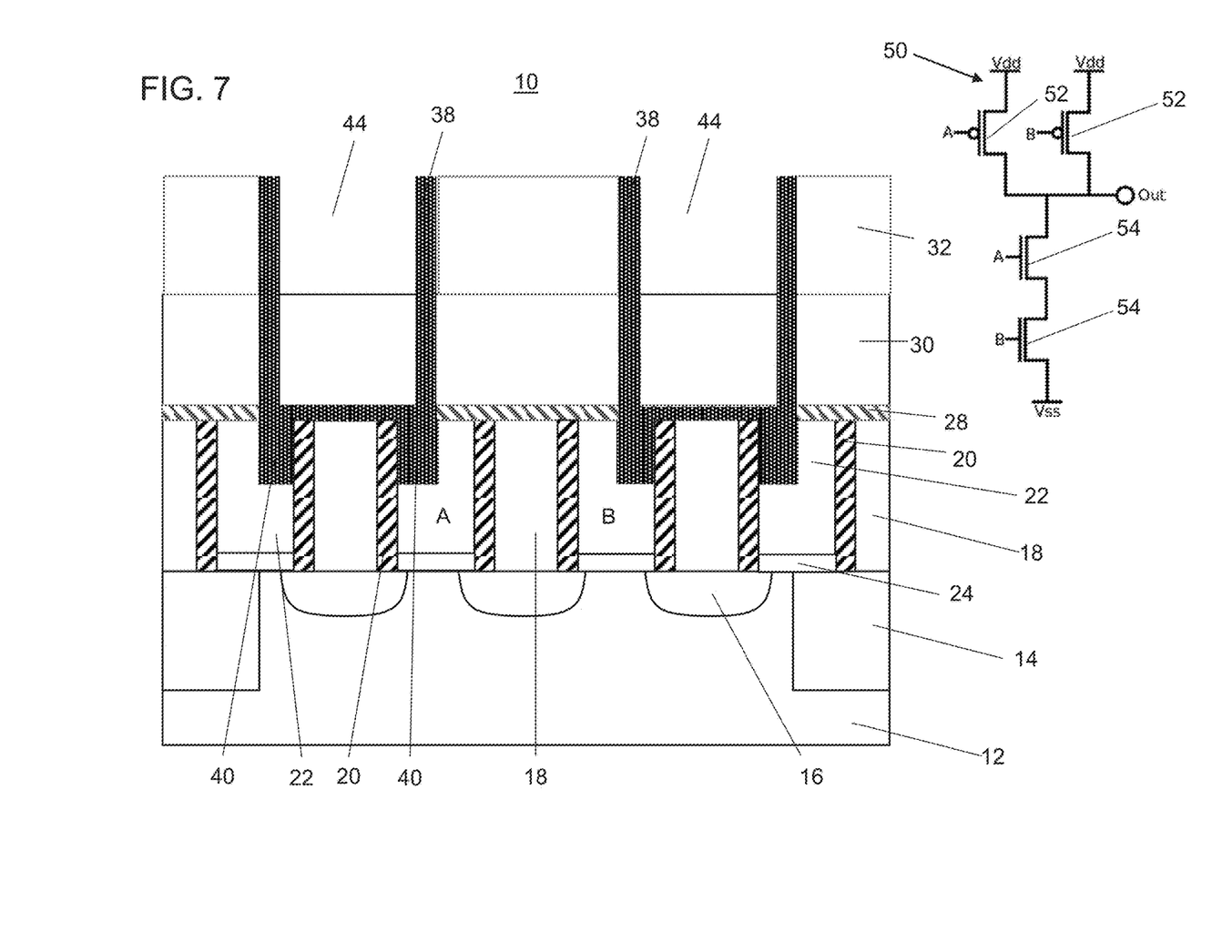
FIG. 7 is a cross-sectional view of the partially fabricated semiconductor device of FIG. 6 showing self-aligned contacts formed in the contact openings, the self-aligned contacts being isolated from the gate conductor by a spacer and a partial cap formed by the dielectric layer and showing a schematic diagram of a two-input NAND gate which can be formed in accordance with the present principles.

Referring to FIG. 7, the contact openings 42 are filled with conductive material. The conductive material may be deposited be any suitable deposition process, e.g., CVD, sputtering, evaporative deposition, etc. A top surface of the device 10 is planarized to form contacts 44. The contacts 44 are self-aligned (SAC) to the underlying source/drain regions 16. The contacts 44 only partially cover the gate conductor 22 and are isolated from the gate conductor 22 by the partial cap 40. A portion of the gate conductor 22 is not recessed, which provides additional conductive material (e.g., more metal volume) for the gate conductor 22 and lowers gate resistance. The partial caps 40 are only needed and formed on top of the gate conductor 22 where the SAC 44 lands.

The contacts 44 may include any suitable conductive material, such as polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tungsten silicide, tungsten nitride, ruthenium oxide, cobalt silicide, nickel silicide), carbon nanotube, conductive carbon, graphene, or any suitable combination of these materials. The conductive material may further comprise dopants that are incorporated during or after deposition.

An illustrative two-input NAND circuit 50 is shown to demonstrate a potential application that could benefit from the present principles. Gate conductors 22 are marked with an "A" and a "B" (two inputs) and could represent the gate nodes of PFETs 52 and/or the gate nodes of NFETs 54. The circuit 50 includes a supply voltage rail(s) (Vdd) and additional voltage rail (Vss or negative supply voltage) as well as an output node (Out).

Figure 8:
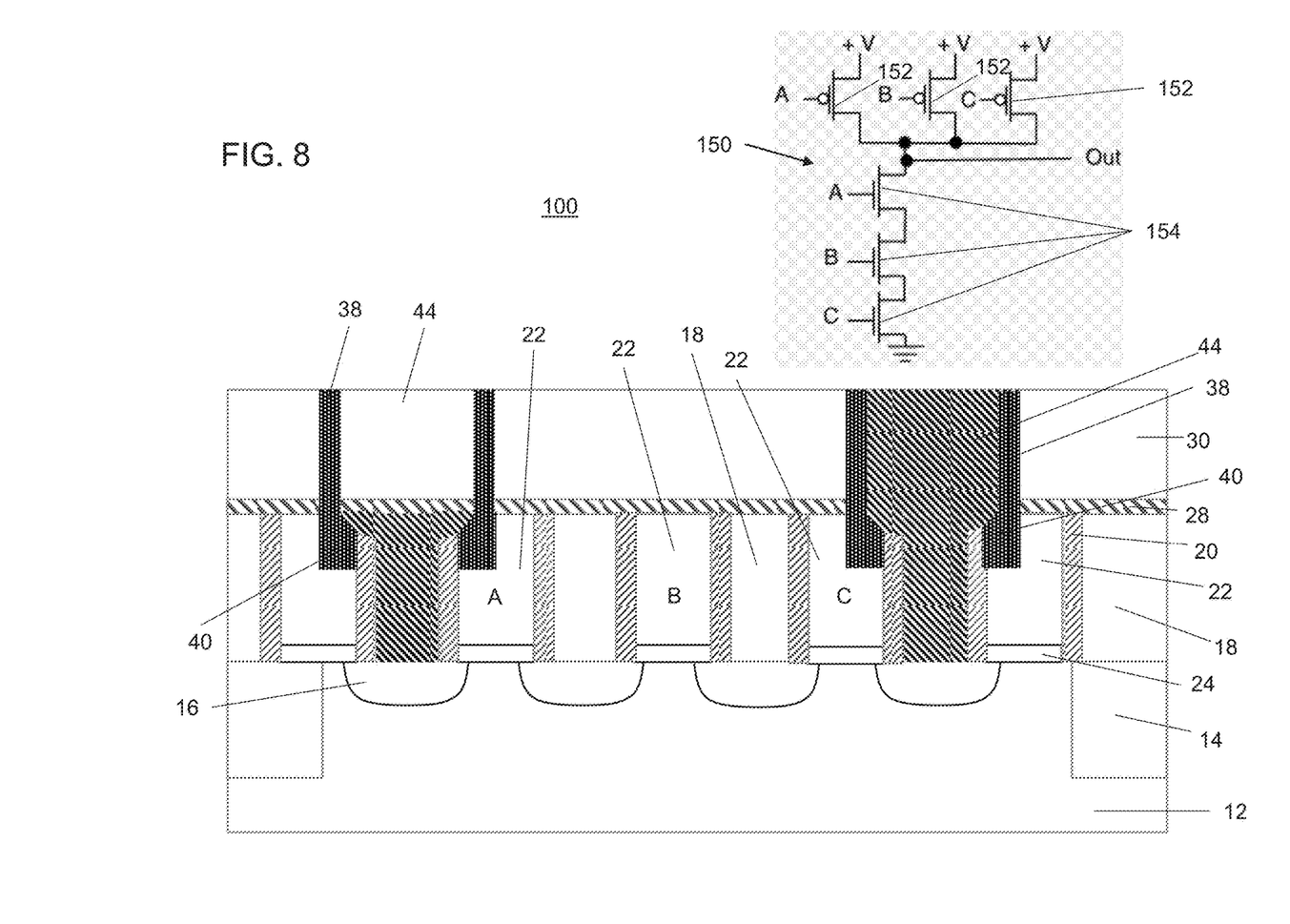
FIG. 8 is a cross-sectional view of a semiconductor device showing self-aligned contacts formed in contact openings, the self-aligned contacts being isolated from the gate conductor by a spacer and a partial cap formed by the dielectric layer, the self-aligned contacts being formed intermittently leaving gates without partial caps and showing a schematic diagram of a three-input NAND gate which can be formed in accordance with the present principles.

Referring to FIG. 8, the contacts 44 are self-aligned (SAC) to the underlying source/drain regions 16. The contacts 44 only partially cover the gate conductor 22 and are isolated from the gate conductor 22 by the partial cap 40. A portion of the gate conductor 22 for gates A and C are not recessed and include partial caps 40. This provides additional conductive material (e.g., more metal volume) for the gate conductors 22 and lowers gate resistance. In the illustrative embodiment shown, the partial caps 40 are only needed on the outer gates A and C. Gate B has no cap at all since the contacts 44 for gates A and C have partial caps and are a fair distance away (shorts or capacitive coupling is less of an issue). The middle gate B does not need a dielectric cap. In a conventional device, all of the gate conductors would include a full dielectric cap to prevent short and/or capacitive coupling from the contacts.

An illustrative three-input NAND circuit 150 is shown to demonstrate a potential application that could benefit from the present principles. Gate conductors 22 are marked with an "A", "B" and "C" (three inputs) and could represent the gate nodes of PFETs 152 and/or the gate nodes of NFETs 154. The circuit 150 includes a supply voltage rail (V+) and ground as well as an output node (Out).

Figure 9:
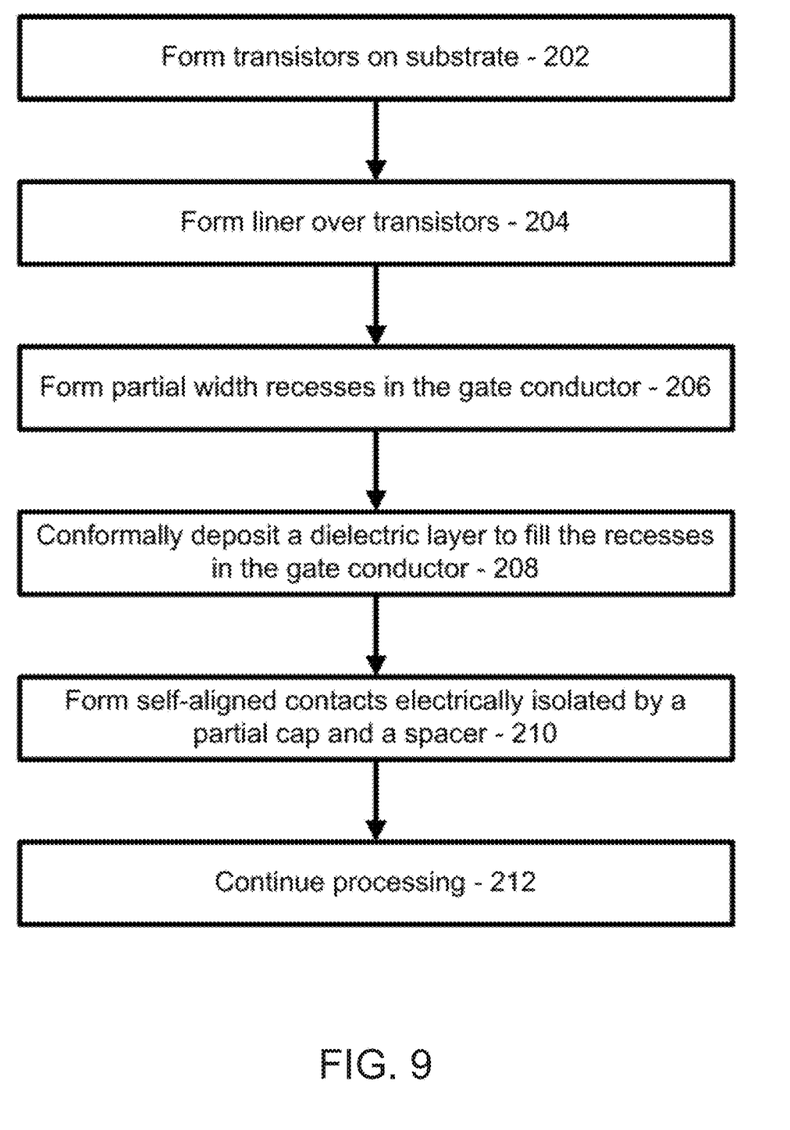
FIG. 9 is a block/flow diagram showing a method for fabricating self-aligned contacts in accordance with the present principles.

Referring to FIG. 9, a method for fabricating self-aligned contacts is illustratively shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 202, a semiconductor device has source/drain regions formed in a substrate. Gate structures are formed between the source/drain regions. The gate regions include a gate dielectric a gate conductor and spacers (at least one). A first interlevel dielectric is formed between the gate structures. Any transistor type of structure may benefit from the present principles. In one embodiment, a planar transistor is employed; however, fin field effect transistor (finFETs), vertical transistors or any other transistor type may be employed. In block 204, a liner is formed over a gate structure(s). The liner may include a thin deposited dielectric. In block 206, an exposed gate conductor is etched to form a recess extending less than a width of the gate conductor.

In block 208, a dielectric layer is conformally deposited to fill the recess between the liner and the at least one sidewall spacer to form a partial dielectric cap formed on the gate conductor. The partial dielectric cap may extend less than one half of a width of the gate conductor and/or extend less than one half of a height of the gate conductor to provide a portion with no cap where the portion extends a full height of the gate conductor. Other dimensions are also contemplated for the gate conductor and the partial cap.

In block 210, a self-aligned contact is formed adjacent to the at least one sidewall spacer of the gate structure and is electrically isolated from the gate conductor by the partial dielectric cap and the at least one sidewall spacer. The dielectric layer may line the sidewalls of an interlevel dielectric formed on the liner wherein the self-aligned contact is formed within the dielectric layer in the sidewalls of the interlevel dielectric, and the dielectric layer is integrally formed with the partial cap.

In block 212, processing continues with the formation of higher metallizations, dielectric layers, etc. Contacts may be omitted form the design based on the reduce profile needed for the SACs in accordance with the present principles.

Having described preferred embodiments for a self-aligned contact (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A method for fabricating self-aligned contacts, comprising:
    forming a horizontal liner directly contacting a top surface of a gate structure, the gate structure having a gate conductor and at least one sidewall spacer, with the top surface of the gate conductor and a top surface of the at least one sidewall spacer being coplanar;

etching an exposed gate conductor to form a recess extending less than a width of the gate conductor;

conformally depositing a dielectric layer to fill the recess between the liner and the at least one sidewall spacer to form a partial dielectric cap formed on the gate conductor; and forming a self-aligned contact adjacent to the at least one sidewall spacer of the gate structure that is electrically isolated from the gate conductor by the partial dielectric cap and the at least one sidewall spacer.

2. The method as recited in claim 1, wherein the partial dielectric cap extends less than one half of a width of the gate conductor and extends less than one half of a height of the gate conductor to provide a portion with no cap where the portion extends a full height of the gate structure.

3. The method as recited in claim 1, wherein the dielectric layer lines sidewalls of an interlevel dielectric formed on the liner wherein the self-aligned contact is formed within the dielectric layer in the sidewalls of the interlevel dielectric and the dielectric layer is integrally formed with the partial dielectric cap.

4. The method as recited in claim 1, wherein the partial dielectric cap extends less than one half of a width of the gate conductor.

5. The method as recited in claim 1, wherein the partial dielectric cap extends less than one half of a height of the gate conductor.

6. The method as recited in claim 1, wherein the gate conductor includes a portion with no cap and the portion extends a full height of the gate structure.

7. The method as recited in claim 1, wherein the self-aligned contact includes a width that extends over a portion of the partial dielectric cap.

8. A method for fabricating self-aligned contacts, comprising:

forming a plurality of gate structures each having a gate conductor and sidewall spacers;

forming a horizontal liner directly contacting top surfaces of the gate structures and top surfaces of the sidewall spacers, with the top surfaces of the gate structures and the top surfaces of the sidewall spacers being coplanar;

forming one or more dielectric layers over the horizontal liner;

etching an opening in the one or more dielectric layers to expose a portion of the gate conductor and one sidewall spacer;

etching an exposed portion of the gate conductor to form a recess extending less than a width of the gate conductor;

conformally depositing a conformal dielectric layer to fill the recess between the horizontal liner and the one sidewall spacer to form a partial dielectric cap on the gate conductor; and forming a self-aligned contact adjacent to the one sidewall spacer of the gate structure that is electrically isolated from the gate conductor by the partial dielectric cap and the one sidewall spacer.

9. The method as recited in claim 8, wherein the partial dielectric cap extends less than one half of a width of the gate conductor and extends less than one half of a height of the gate conductor to provide a portion with no cap where the portion extends a full height of the gate structure.

10. The method as recited in claim 8, wherein the conformal dielectric layer lines sidewalls of the one or more dielectric layers formed on the horizontal liner wherein the self-aligned contact is formed within the conformal dielectric layer in the sidewalls of the one or more dielectric layers and the conformal dielectric layer is integrally formed with the partial dielectric cap.

11. The method as recited in claim 8, wherein the partial dielectric cap extends less than one half of a width of the gate conductor.

12. The method as recited in claim 8, wherein the partial dielectric cap extends less than one half of a height of the gate conductor.

13. The method as recited in claim 8, wherein the gate conductor includes a portion with no cap and the portion extends a full height of the gate structure.

14. The method as recited in claim 8, wherein the self-aligned contact includes a width that extends over a portion of the partial dielectric cap.

15. The method as recited in claim 1, wherein the partial dielectric cap extends greater than one half of a width of the gate conductor.

16. The method as recited in claim 8, wherein the partial dielectric cap extends greater than one half of a width of the gate conductor.

* * * * *